United States Patent [19]

Haino

[11] Patent Number: 4,637,047
[45] Date of Patent: Jan. 13, 1987

[54] LEVEL INDICATION APPARATUS FOR DIGITALLY ENCODED AUDIO SIGNAL DATA

[75] Inventor: Nobuo Haino, Tokorozawa, Japan

[73] Assignee: Pioneer Electronic Corporation, Tokyo, Japan

[21] Appl. No.: 666,306

[22] Filed: Oct. 30, 1984

[30] Foreign Application Priority Data

Nov. 1, 1983 [JP] Japan .................. 58-169559[U]

[51] Int. Cl.[4] .......................................... H04R 29/00
[52] U.S. Cl. ...................................... 381/58; 324/96;
324/102; 455/159; 340/753; 307/350; 328/151
[58] Field of Search ................ 324/96, 102, 122, 133;
455/159; 381/104, 105, 106, 107, 108, 109, 58,
56; 307/350, 359; 328/150, 151; 340/715, 753,
754, 772

[56] References Cited

U.S. PATENT DOCUMENTS

| | | | |
|---|---|---|---|
| 3,587,083 | 6/1971 | Tubinis | 340/740 X |
| 3,754,121 | 8/1973 | Delay et al. | 324/96 |
| 4,083,042 | 4/1978 | Kushin et al. | 340/753 |
| 4,213,125 | 7/1980 | Watanabe | 324/96 |
| 4,241,342 | 12/1980 | Merriweather | 324/96 |
| 4,281,290 | 7/1981 | Peacey et al. | 324/133 |
| 4,385,399 | 5/1983 | Ogita | 455/159 |

Primary Examiner—Forester W. Isen
Attorney, Agent, or Firm—Fleit, Jacobson, Cohn & Price

[57] ABSTRACT

An apparatus for indicating the level of digitally encoded audio data, in which a set of bits representing the audio signal amplitude are periodically latched in a latch circuit, with the resultant output bit signals from the latch circuit being displayed by means such as LED elements, with the period of repetitive latching operations being made to vary in accordance with the audio signal level, such as to increase in response to increases in that level.

4 Claims, 4 Drawing Figures

LEVEL INDICATION APPARATUS FOR DIGITALLY ENCODED AUDIO SIGNAL DATA

BACKGROUND OF THE INVENTION

Various types of equipment which produce digitally encoded audio data are in widespread use at present, such as apparatus for playback of digitally encoded data from compact audio discs. It is possible to implement signal level indication means for such equipment by displaying the level of the analog audio signal which is produced by analog-to-digital conversion of the digitally encoded audio data, i.e. to utilize a conventional type of audio level display apparatus, utilizing meters for example. However such level indication means cannot accurately and rapidly follow rapid changes in the audio signal level, and a much more rapid and accurate indication of the level of digitally encoded audio data can be provided by indicating the logical states of the bits constituting the digital data, prior to A-D conversion. This can be done, for example, by using an array of LED elements to display the respective bit states. However it has been found that such direct display of the digitally encoded audio data does not provide an optimum degree of display clarity to the user, so that changes in audio signal level may not be readily comprehended, due to the rapidity of changes in display state of the indicating elements. That is to say, the indicating elements will change in accordance with the frequency at which the original audio signal was sampled in order to produce the digitally encoded audio data.

It is possible to produce some improvement of the display quality by providing means for periodically latching the bits of the digitally encoded audio data at a lower frequency than that of the original sampling frequency, to thereby effectively reduce the rate at which the displayed data will change. However this has the disadvantage if the repetition frequency of the latching operations is made sufficiently low to provied an improvement in display quality, it is found that rapid changes in the audio data, and in particular rapidly changing peaks in signal amplitude, cannot be accurately followed by the level display.

SUMMARY OF THE DISCLOSURE

It is an objective of the present invention to overcome the disadvantages of prior art types of apparatus for indicating the level of digitally encoded audio data, whereby a clear indication of changes in signal level is provided to the user and furthermore whereby rapid changes in signal level are accurately followed by the indication apparatus.

To attain the above objectives, a level indication apparatus for digitally encoded audio data basically comprises a plurality of latch circuits for latching the bits of the digitally encoded audio data, a set of electro-optical display elements for respectively indicating the states of the bits thus held in the latch circuits, a level discrimination circuit for judging the level of the digitally encoded audio data as indicated by the contents of the latch circuits, and a control circuit for controlling the frequency of periodically repeated latching operations of the latch circuits in accordance with the audio signal level as designated by output signals from the level discrimination circuit.

More specifically, output signals from the level discrimination circuit act to control the frequency of the latching operations such as to increase in accordance with increases in the level of the audio signal level.

Such an apparatus can be conveniently implemented if it is arranged that the level discrimination circuit discriminates between a relatively small number of ranges of the audio signal level, controlling the frequency of the latching operations to vary over a corresponding number of discrete values.

DESCRIPTION OF THE PREFERRED EMBODIMENTS

Figure 1:
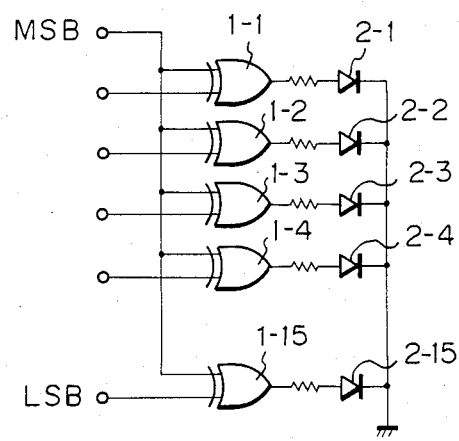
FIG. 1 is a circuit diagram of a prior art example of a level indication apparatus for digitally encoded audio data, comprising a circuit for converting digital data encoded in 2's complement form into digital data representing an absolute value.

FIG. 1 is a circuit diagram of an example of a prior art type of apparatus for indicating the level of digitally encoded audio data, for use with data comprising 16 parallel bits which are encoded in 2's complement form. Numeral 1-1 to 1-15 denote exclusive-OR gates, to which the 16 bits of parallel data (other than the most significant bit MSB) are respectively input. The MSB is input in common to all of the exclusive-OR gates. Numerals 2-1 to 2-15 denote LED (light-emitting diode) elements which are respectively coupled to the outputs of exclusive-OR gates 1-1 to 1-15. The LED elements are connected such that each is set in the ON (i.e. light-emitting) state when the output signal from the corresponding exclusive-OR gate is at the high logic level potential.

With a 2's complement data configuration, the logic level of the MSB indicates the polarity of the original analog (audio) signal from which the data was encoded. If the MSB is at the low logic level (hereinafter referred to simply as 0) then this indicates that the signal polarity is positive, while if the MSB is at the high logic level (referred to hereinafter as 1), then this indicates a negative polarity. If the MSB is 0 and all of the other bits are 1, then this corresponds to an audio signal level of 0 dB. If all of the 16 bits are 0 or if all of them are 1, then this corresponds to a signal level of $-\infty$ dB. If the MSB is 1 and all of the other bits are 0, then this also corresponds to a signal level of 0 dB.

A level indication apparatus for audio signal data must display the absolute level of the data. In the case of data encoded in 2's complement form, if the MSB is 0 then the signal level can be indicated by directly controlling a set of indicating elements (e.g. LEDs) in accordance with the logic levels of the remaining bits of the data. However if the MSB is 1, then it is necessary to invert the 1 or 0 states of all bits other than the MSB, before applying these bits to indicate the audio data signal level. In the circuit of FIG. 1, the exclusive-OR gates 1-1 to 1-15 constitute an absolute value conversion circuit for the 2's complement data. If the MSB is 0, then the signal (other than the MSB) which is input to each exclusive-OR gate will result in an identical level of output signal from the gate. If the MSB is 1, then the signal (other than the MSB9 which is input to each exclusive-OR gate will be inverted by the gate. If the output from any of exclusive-OR gates 1-1 to 1-15 is at the 1 level, then the corresponding one of LED elements 2-1 to 2-15 will be set in the on (i.e. light-emitting state), while the LED element is set in the off state if the corresponding exclusive-OR gate output is at the 0 level.

The level of the digitally encoded audio data is thereby directly indicated by the manner in which the array of LED elements are respectively set in the on and off states, in accordance with the 1 or 0 logic states of the data bits. However the timings at which the display is periodically changed, i.e. updated, are determined by the rate at which sampling of the original audio signal was performed, to encode that signal in digital form. It has been found that such a rate of display updating results in poor clarity of display.

Figure 2:
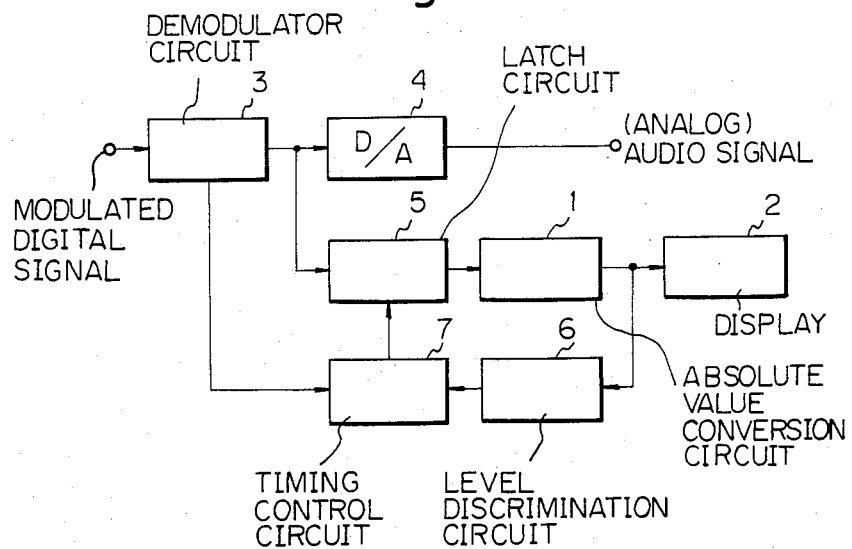
FIG. 2 is a general block circuit diagram of an embodiment of a level indication apparatus according to the present invention.

Referring now to FIG. 2, an embodiment of a level indication apparatus for digitally encoded audio data according to the present invention is shown, in general block diagram form. A signal which is modulated with digital data is applied to an input terminal of a digital signal demodulator circuit 3. This signal may be produced, for example, by the pickup unit of a playback apparatus for digitally encoded audio discs. The demodulated digital signal thus produced by demodulator circuit 3 is input to a D-A (digital-to-analog) converter circuit 4, to be converted to an analog audio signal. The digitally encoded audio data from demodulator circuit 3 is also input to a latch circuit 5, whose output signals are converted into signals representing the absolute value of the audio signal level by an absolute value conversion circuit 1. The output signals from the absolute value conversion circuit 1 are applied to display elements in a display section 2, and are also input to a level discrimination circuit 6, which makes a judgement as to the level of the data value represented by the bits held in latch circuit 5. More specifically, level discrimination circuit 6 produces discrimination output signals to indicate that the current audio signal level falls within one of a plurality of predetermined level ranges. These discrimination output signals are applied to a timing control circuit 7, together with sync signal pulses which are derived from the modulated digital signal input, by demodulator circuit 3. In response, timing control circuit 7 produces a latch signal which is input to latch circuit 5 to control the frequency of periodic latching operations thereof, this latch signal being synchronized with the sync signal pulses output from demodulator circuit 3.

Figure 3:
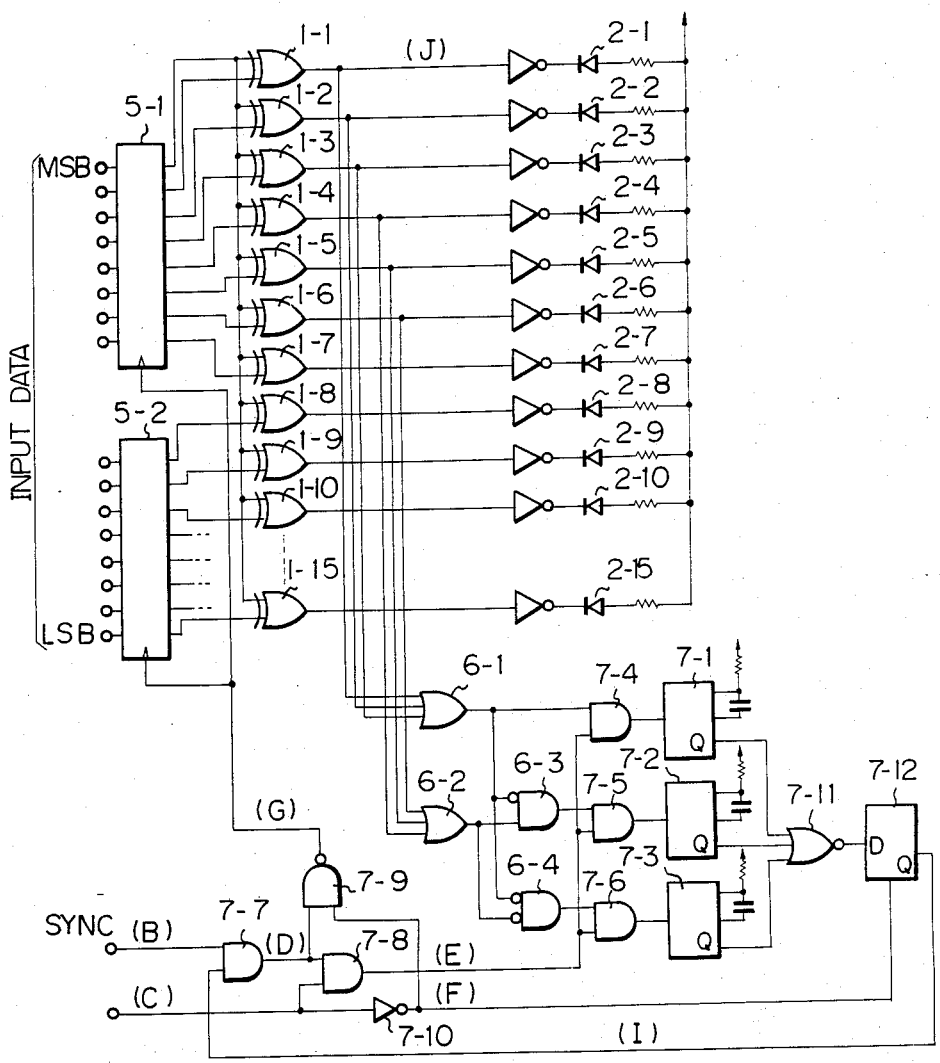
FIG. 3 is a circuit diagram of the principal circuit blocks in FIG. 2.

FIG. 3 shows an example of a detailed circuit configuration for the blocks in FIG. 2 which constitute an embodiment of the present invention, i.e. blocks 1, 2, 5, 6, and 7. This embodiment is for use with digitally encoded audio data which is encoded in 2's complement form, comprising 16 parallel bits. Numerals 5-1, 5-1 denote latch circuits (shown as a pair of 8-bit integrated circuit chips) for retaining the 16 input data bits, with latching operations being performed in a periodic manner, controlled as described hereinafter.

In this embodiment, the full-scale signal level threshold set by level discrimination circuit 6 is 0 dB, while discrimination thresholds are established at the −18 dB and −36 dB signal levels. That is to say, level discrimination circuit 6 acts to judge whether the audio signal level lies within the ranges 0 dB to −18 dB, −18 dB to −36 dB, or less than −36 dB, i.e. three ranges of signal levels. Level discrimination circuit 6 comprises OR gates 6-1 and 6-1 and AND gates 6-3 and 6-4 provided with inhibit inputs as shown in FIG. 3.

As in the prior art example described above, absolute value conversion circuit 1 comprises a set of exclusive-OR gates 1-1 to 1-15, which receive the output signals from latch circuits 5-1, 5-2, The three high order bits which are output from these gates (i.e. from exclusive-OR gates 1-1, 102 and 103) are input to OR gate 6-1, while the next lower order 3 bits are input to OR gate 6-2. Thus, the output of OR gate 6-1 goes to the 1 level if any one of the three high-order bits of the 15 bits of absolute value data is 1, i.e. if the input audio signal level is greater than −18 dB. Similarly, the output from OR gate 6-2 goes to the 1 level if the audio signal level is higher than −36 dB. If the audio signal level is less than −36 dB, then the outputs of both of OR gates 6-1, 6-2 will be 0.

The output signal from OR gate 6-1 is applied to one input of an AND gate 7-4, and also to inverting inputs of AND gates 6-3 and 6-4, while the output from OR gate 6-2 is applied to an input of AND gate 6-3 and to an inverting input of AND gate 6-4. Thus, when the output from OR gates 6-1 and 6-2 are both at the logic 0 level, the output from AND gate 6-4 will be 1, i.e. a 1 level output from AND gate 64 indicates that the audio signal level is in the range below −36 dB. Similarly, if the output of OR gate 6-2 is 1 and the output from OR gate 6-1 is 0, then this indicates that the audio signal level is in the range −18 dB to −36 dB, and a corresponding 1 level output will be produced by AND gate 6-3, while as stated above, an audio signal level in the range above −18 dB will be indicated by a 1 level output from OR gate 6-1. In this way, three ranges of audio signal level are defined by the level discrimination circuit, which produces an output signal to indicate within which range the current audio signal level falls.

Figure 4:
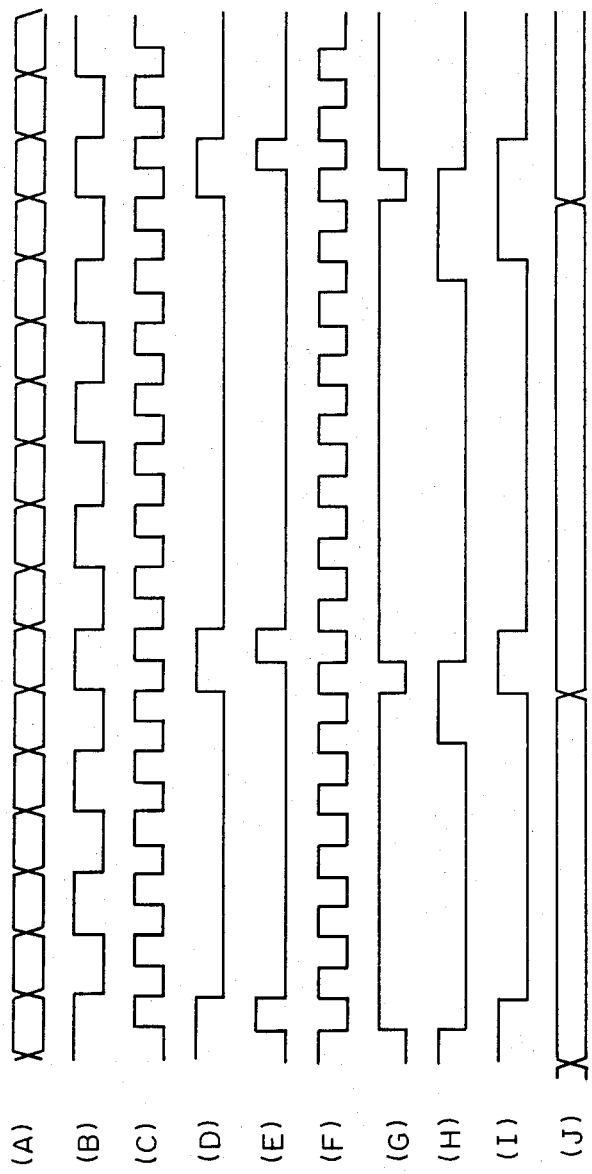
FIG. 4 is a timing chart for illustrating the operation of the embodiment of FIGS. 2 and 3.

Timing control circuit 7 of FIG. 2 is constituted by AND gates 7-4, 7-5, 7-6, 7-7, 7-8, NAND gate 7-9, NOR gate 7-11, inverter 7-10, three monostable multivibrators (hereinafter MMVs) 7-1 to 7-3, and a data-type flip-flop (hereinafter DFF) 7-2. The operation of the timing control circuit will be described with reference to the timing chart of FIG. 4, which shows the waveforms of signals (A) to (J) indicated in the circuit of FIG. 3. Waveform (A) shows the variation in level of a bit within the 16-bit parallel input data constituting the digitally encoded audio data. This data is assumed to comprise two-channel multiplex (i.e. stereo-separated) data, and the sync signal whose waveform is shown as (B), output from demodulator circuit 3 in FIG. 2, is used to separate the two channels. Only the waveforms for one of these audio signal channels, i.e. for the data which corresponds in timing to intervals when sync signal (B) is at the 1 level, are shown in FIG. 4. Waveform (C) is that of a signal which is synchronized with sync signal (B), but whose frequency is twice that of signal (B). The MMVs 7-1 to 7-3 each have a different time constant, with that of MMV 7-1 being shorter than that of MMVs 7-2 and 7-3, and with the time constant of MMV 7-2 being shorter than that of MMV 7-3. The output signals from AND gates 7-4 to 7-6 are applied as trigger input signals to MMVs 7-1 to 7-3 respectively, while the output signals from MMVs 7-1 to 7-3 are applied to inputs of NOR gate 7-11, whose output is applied to the data input terminal of DFF 7-12. The Q output of DFF 7-12 is applied to one input of AND gate 7-7, while the sync signal (B) is applied to the other input of AND gate 7-7. The output signal (D) of AND gate 7-7 is applied to one input of NAND gate 7-9 and to one input of AND gate 7-8. The doubled-frequency sync signal (C) is applied to the other input of AND gate 7-8, and is inverted to be applied as signal (F) to the other input of NAND gate 7-9 and to the clock input of DFF 7-12. The output signal (E) of AND gate 7-8 is applied to one input of each of AND gates 7-4, 7-5 and 7-6, while the level range designating output signals from OR gate 6-1, AND gate 6-3 and AND gate 6-4 are respectively applied to the other inputs of AND gates 7-4, 7-5 and 7-6. Output signal (G) from NAND gate 7-9 is applied as a latch control input to each of latch circuits 5-1 and 5-2. While signal (G) is at the 0 level, latch circuits 5-1, 5-2 latch in the parallel bits of the data, and the data is held stored in the latch circuits when signal (G) returns to the 1 level.

If the Q output signal from DFF 7-12 is at the 1 level, then the output signal (D) from AND gate 7-7 will be at the 1 level during intervals in which sync signal (B) is at the 1 level, and such 1 level pulses of signal (D) will be referred to as trigger pulses. Furthermore, when any one of the output signals from gates 6-1, 6-3 or 6-4 of the level discrimination circuit goes to the 1 level, then a trigger pulse of signal (D) will cause a 1 level output trigger pulse to be produced by the corresponding one of AND gates 7-4 to 7-6, whereby a corresponding one of MMVs 7-1 to 7-3 will be triggered. The Q output signal of that MMV wll thus go to the 1 level for a time interval which is determined by the time constant of the MMV, and hence output (H) of NOR gate 7-11 will remain at the 0 level during that time interval. Thus, due to signal (F) applied to the clock input of DFF 7-12, the Q output of DFF 7-12 will go to the 0 level, and will remain at the level until the next positive-going transition of signal (F) after the triggered DFF output returns to the 0 level. In this way, signal (I), and hence output signal (D) from AND gate 7-7, will be synchronized with sync signal (B). During the intervals in which this signal (D) is at the 0 level, output of both latching control signal (G) and trigger signal (E) is inhibited, and during these intervals, the set of LED elements 2-1 to 2-15 respectively continuously display the outputs of exclusive-OR gates 1-1 to 1-15, to thereby indicate the absolute level of the digitally encoded audio data held in latch circuits 5-1 and 5-2.

When the Q output of the MMV triggered as described above subsequently returns to the 0 level, then signal (I) from DFF 7-12 goes to the 1 level upon the next 0-to-1 excursion of signal (F). Output signal (D) from AND gate 7-7 thereby goes to the 1 level in synchronism with sync signal (B), so that when signal (F) subsequently goes to the 1 level, latching control signal (G) again goes to 0, to thereby latch in a new set of data to latch circuits 5-1, 5-2, while trigger signal (E) again goes to the 1 level. As a result, one of MMVs 7-1 to 7-6 (selected in accordance with the level range within which the newly latched data falls, as determined by level discrimination circuit 6 as described above) is triggered, and the sequence of operations described above is then repeated.

It can thus be understood that the period of successive latching operations by latch circuits 5-1, 5-2 is controlled in accordance with the absolute value of the audio signal level, as represented by the output signals from exclusive-OR gates 1-1 to 1-15, and that this period is set to a minimum value (determined by MMV 7-1) when the audio signal level is higher than −18 dB (indicated by LEDs 2-1 to 2-15 as the range 0 dB to −18 dB), is set to an intermediate value (determined by MMV 7-2) when the audio signal level is in the range −18 dB to −36 dB, and is set to a maximum value (determined by MMV 7-3) when the audio signal level is in the range below −36 dB.

It will be apparent that various modifications to the configuration described above may be envisaged, to attain the desired objectives of the present invention. For example, it is possible to use a greater number of different signal level ranges than three, and the number of dB steps within each level range can vary accordingly from those used for the described embodiment. Furthermore, with the described embodiment, each level range must be an integral multiple of 3 dB. However it is equally possible to employ a comparator circuit to compare the level of the analog audio signal produced by A-D conversion of the encoded digital signal with reference level values, rather than to employ the digital type of level discrimination circuit used in the described embodiment. If this is done, there is no limitation upon the extent of each level range.

It should be further noted that timing of the period of latching operations can be accomplished by using counter circuits, rather than the MMVs used in the described embodiment.

It should also be noted that the present invention is applicable to digitally encoded audio data which is encoded in a form other than 2's complement, for example data encoded in offset binary form. The invention can also be employed for data which is input in serial form, by adding a serial-to-parallel conversion circuit.

In FIG. 3, only the components necessary to implement level display for one channel of two-channel multiplex data is shown. However it will be apparent that the embodiment can be readily expanded to provide a display of both data channels, i.e. each channel of stereo audio data, by suitable duplication of components shown in FIG. 3.

Thus, although the present invention has been described in the above with reference to a specific embodiment, various changes and modifications to the embodiments may be envisaged, which fall within the scope claimed for the invention as set out in the appended claims. The above specification should therefore be interpreted in a descriptive and not in a limiting sense.

What is claimed is:

1. A level indication apparatus for indicating the level of digitally encoded audio data, comprising:
   latch circuit means for latching the bits of said digitally encoded audio data, to produce output signals corresponding respectively in logic level to said bits;
   level discrimination means coupled to said latch circuit means output signals for producing output signals indicative of the level of said digitally encoded audio data;
   timing control circuit means coupled to said latch circuit means for implementing repetitive latching operations thereof, and responsive to said level discrimination means output signals for controlling the period of said latching operations in accordance with the level of said digitally encoded audio data; and
   display means comprising a plurality of electro-optical display elements, each controlled by a corresponding one of said latch circuit means output signals such as to be selectively set into first and second display states in accordance with the logic level of said corresponding latch circuit means output signal.

2. A level indication apparatus according to claim 1, in which said timing control circuit means act to reduce the period of said repetitive latching operations in accordance with an increasing level of said digitally encoded audio data.

3. A level indication apparatus according to claim 1, in which said level discrimination means act to detect a range of signal levels within which the level of said digitally encoded audio data falls, from among a plurality of predetermined successively increasing ranges of signal levels, and in which said timing control circuit means act to select the period of said latching operations from among a plurality of predetermined different values of said period in accordance with the signal level range thus determined.

4. A level indication apparatus according to claim 1, and further comprising absolute value conversion circuit means coupled between said latch circuit means and said display means, for converting digitally encoded audio data encoded in 2's complement form into digital data representing an absolute data value.

* * * * *